US008859997B2

(12) United States Patent
Kamikubo (10) Patent No.: US 8,859,997 B2
(45) Date of Patent: Oct. 14, 2014

(54) CHARGED PARTICLE BEAM WRITING APPARATUS AND CHARGED PARTICLE BEAM WRITING METHOD

(75) Inventor: Takashi Kamikubo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/368,786

(22) Filed: Feb. 8, 2012

(65) Prior Publication Data

US 2012/0211676 A1    Aug. 23, 2012

(30) Foreign Application Priority Data

Feb. 18, 2011  (JP) ................................. 2011-032792

(51) Int. Cl.
*A61N 5/00* (2006.01)
*G21K 5/10* (2006.01)
*H01J 37/317* (2006.01)

(52) U.S. Cl.
CPC ... *H01J 37/3174* (2013.01); *H01J 2237/31776* (2013.01); *H01J 2237/30483* (2013.01); *H01J 2237/31793* (2013.01)
USPC ................. 250/492.3; 250/492.2; 250/492.22

(58) Field of Classification Search
CPC .................................. A61N 5/00; G21K 5/10
USPC ....................................................... 250/492.3
See application file for complete search history.

(56) References Cited

U.S. PATENT DOCUMENTS

| 6,538,248 B1 * | 3/2003 | Kametani et al. ............. 250/310 |
| 2002/0053634 A1 * | 5/2002 | Watanabe et al. .......... 250/201.2 |
| 2007/0023689 A1 | 2/2007 | Iizuka et al. |
| 2007/0103659 A1 | 5/2007 | Yoshitake et al. |

FOREIGN PATENT DOCUMENTS

| JP | 05-206017 | 8/1993 |
| JP | 11-149895 A | 6/1999 |
| JP | 3036081 B2 | 2/2000 |
| JP | 2004-006892 | 1/2004 |
| JP | 2007-43083 | 2/2007 |
| JP | 2009-200147 | 9/2009 |
| JP | 2010-192538 | 9/2010 |
| KR | 10-0776479 | 11/2007 |

OTHER PUBLICATIONS

Office Action issued Jun. 24, 2013 in Korean Patent Application No. 10-2012-0015434 (with English language translation).

(Continued)

*Primary Examiner* — Phillip A Johnston
(74) *Attorney, Agent, or Firm* — Oblon, Spivak, McClelland, Maier & Neustadt, L.L.P.

(57) ABSTRACT

A charged particle beam writing apparatus includes an unit to measure height positions of a substrate, an unit to input a position dependent height distribution obtained by converting each position error of a pattern generated depending on each corresponding writing position of the substrate into a value in a height direction, and to add the position dependent height distribution to a height distribution obtained based on the height positions in order to correct the height distribution of the substrate, an unit to calculate a deflection shift amount of a pattern to be written by using a corrected height distribution, an unit to calculate a deflection amount for deflecting a beam to a position where a calculated deflection shift amount has been corrected, and an unit to write a pattern on the substrate by deflecting the beam by a calculated deflection amount.

10 Claims, 5 Drawing Sheets

(56) References Cited

OTHER PUBLICATIONS

Korean Office Action issued Jan. 7, 2014, in Korea Patent Application No. 10-2012-0015434 (with English translation).
Combined Taiwanese Office Action and Search Report issued Feb. 24, 2014, in Patent Application No. 101103420 (with English-language translation).
Office Action issued Jul. 31, 2014, in Korean Patent Application No. 10-2012-0015434, (with English-language Translation).
Office Action issued Aug. 12, 2014, in Japanese Patent Application No. 2011-032792, filed Feb. 18, 2011 (with English-language Translation).

* cited by examiner

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2011-032792 filed on Feb. 18, 2011 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to a writing method and apparatus that performs deflection position correction based on a height distribution of a substrate.

2. Description of Related Art

The microlithography technique which advances micro-miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

Figure 6:
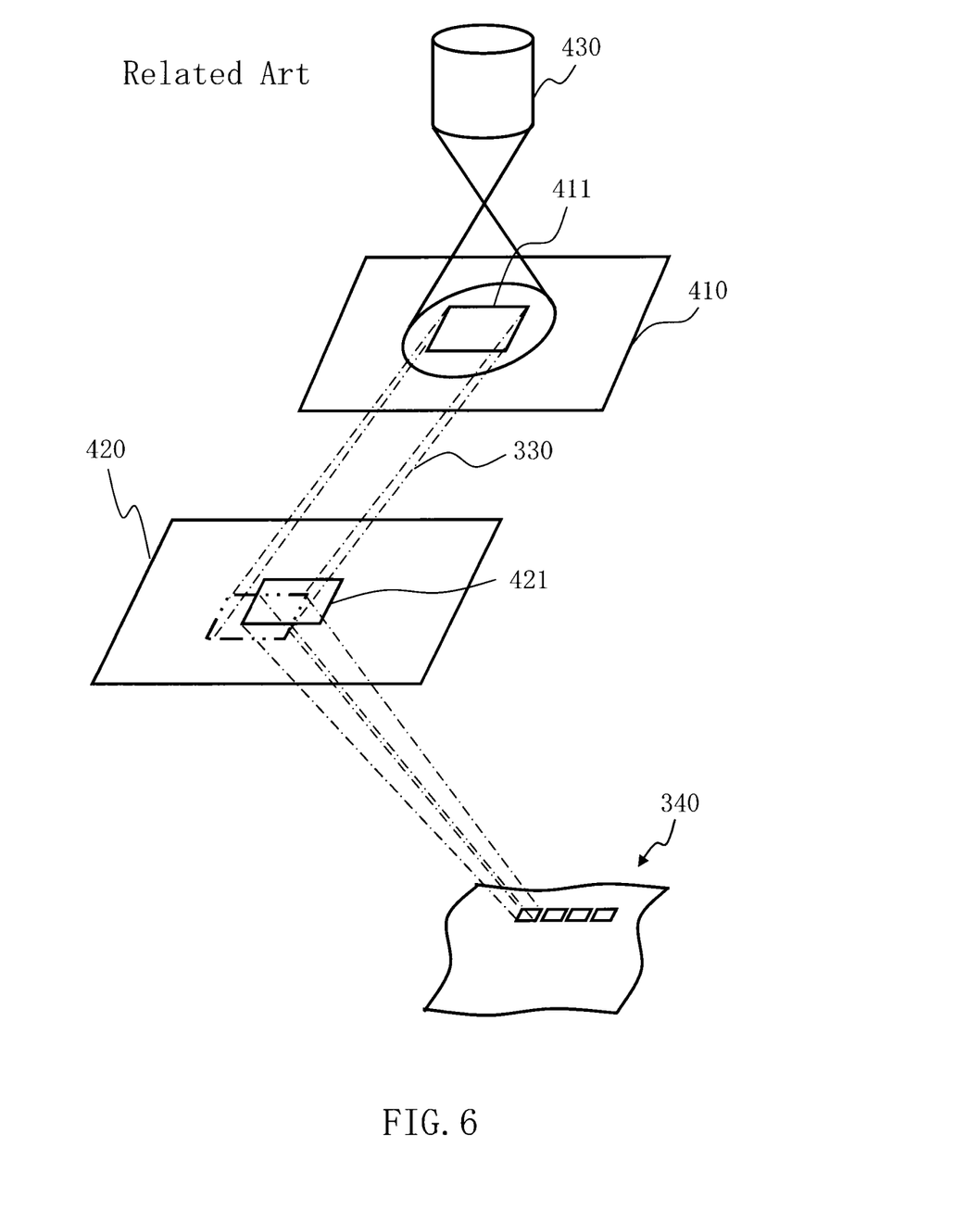
FIG. 6 is a schematic diagram explaining operations of a variable-shaped electron beam writing apparatus.

FIG. 6 is a schematic diagram explaining operations of a variable-shaped electron beam (EB) writing apparatus. As shown in the figure, the variable-shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

When performing the electron beam writing, there are various factors which generate a position error of the writing apparatus. Deflection error of an electron beam can be cited as one of the factors. Since the writing surface of a substrate is not perfectly even, there are irregularities (concave or convex) on it. Due to height distribution caused by such unevenness, the focal position shifts and the writing dimension also changes. Then, in order to correct, by using a deflection position of the beam, such a writing dimension deviation generated due to the height distribution of the writing surface, there is disclosed a method (e.g., refer to Japanese Unexamined Patent Publication No. 2007-043083) of correcting a deflection position based on the height distribution of the substrate surface, for example. However, with miniaturizing patterns, it is becoming unable to satisfy the requirement of the dimension accuracy if performing only a conventional deflection position correction, because a correction residual error remains for the requirement of dimension accuracy. Therefore, for example, in a multiple writing method, such as a double patterning, it is becoming necessary to suppress a position error to be several nanometers or less, for example.

BRIEF SUMMARY OF THE INVENTION

In accordance with one aspect of the present invention, a charged particle beam writing apparatus includes a measurement unit configured to measure a plurality of height positions of a substrate to be written, a height distribution correction unit configured to input a position dependent height distribution that is obtained by converting each position error of a pattern generated depending on each corresponding writing position of the substrate into a value in a height direction, and to add the position dependent height distribution to a height distribution that is obtained based on the plurality of height positions, in order to correct the height distribution of the substrate, a deflection shift amount calculation unit configured to calculate a deflection shift amount of a pattern to be written by using a corrected height distribution, a deflection amount calculation unit configured to calculate a deflection amount for deflecting a charged particle beam to a position where a calculated deflection shift amount has been corrected, and a writing unit configured to write a pattern on the substrate by deflecting the charged particle beam by a calculated deflection amount.

In accordance with another aspect of the present invention, a charged particle beam writing apparatus includes a measurement unit configured to measure a plurality of height positions of a substrate to be written, a height distribution correction unit configured to input a time dependent height distribution that is obtained by converting each position error of a pattern generated depending on each corresponding writing time for the substrate into a value in a height direction, and to add the time dependent height distribution to a height distribution that is obtained based on the plurality of height positions, in order to correct the height distribution of the substrate, a deflection shift amount calculation unit configured to calculate a deflection shift amount of a pattern to be written by using a corrected height distribution, a deflection amount calculation unit configured to calculate a deflection amount for deflecting a charged particle beam to a position where a calculated deflection shift amount has been corrected, and a writing unit configured to write a pattern on the substrate by deflecting the charged particle beam by a calculated deflection amount.

In accordance with still another aspect of the present invention, a charged particle beam writing method includes measuring a plurality of height positions of a substrate to be written, inputting a position dependent height distribution that is obtained by converting each position error of a pattern generated depending on each corresponding writing position of the substrate into a value in a height direction, and adding the position dependent height distribution to a height distribution that is obtained based on the plurality of height positions, in order to correct the height distribution of the substrate, calculating a deflection shift amount of a pattern to be written by using a corrected height distribution, calculating a deflection amount for deflecting a charged particle beam to a position where a calculated deflection shift amount has been corrected, and writing a pattern on the substrate by deflecting the charged particle beam by a calculated deflection amount.

In accordance with a further aspect of the present invention, a charged particle beam writing method includes measuring a plurality of height positions of a substrate to be written, inputting a time dependent height distribution that is obtained by converting each position error of a pattern generated depending on each corresponding writing time for the substrate into a value in a height direction, and adding the time dependent height distribution to a height distribution that is obtained based on the plurality of height positions, in order to correct the height distribution of the substrate, calculating a deflection shift amount of a pattern to be written by using a corrected height distribution, calculating a deflection amount for deflecting a charged particle beam to a position where a calculated deflection shift amount has been corrected, and writing a pattern on the substrate by deflecting the charged particle beam by a calculated deflection amount.

DETAILED DESCRIPTION OF THE INVENTION

Embodiment 1

In the following Embodiment, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

In the following Embodiment, there will be described a writing apparatus and a writing method capable of enhancing the deflection precision further than before.

Figure 1:
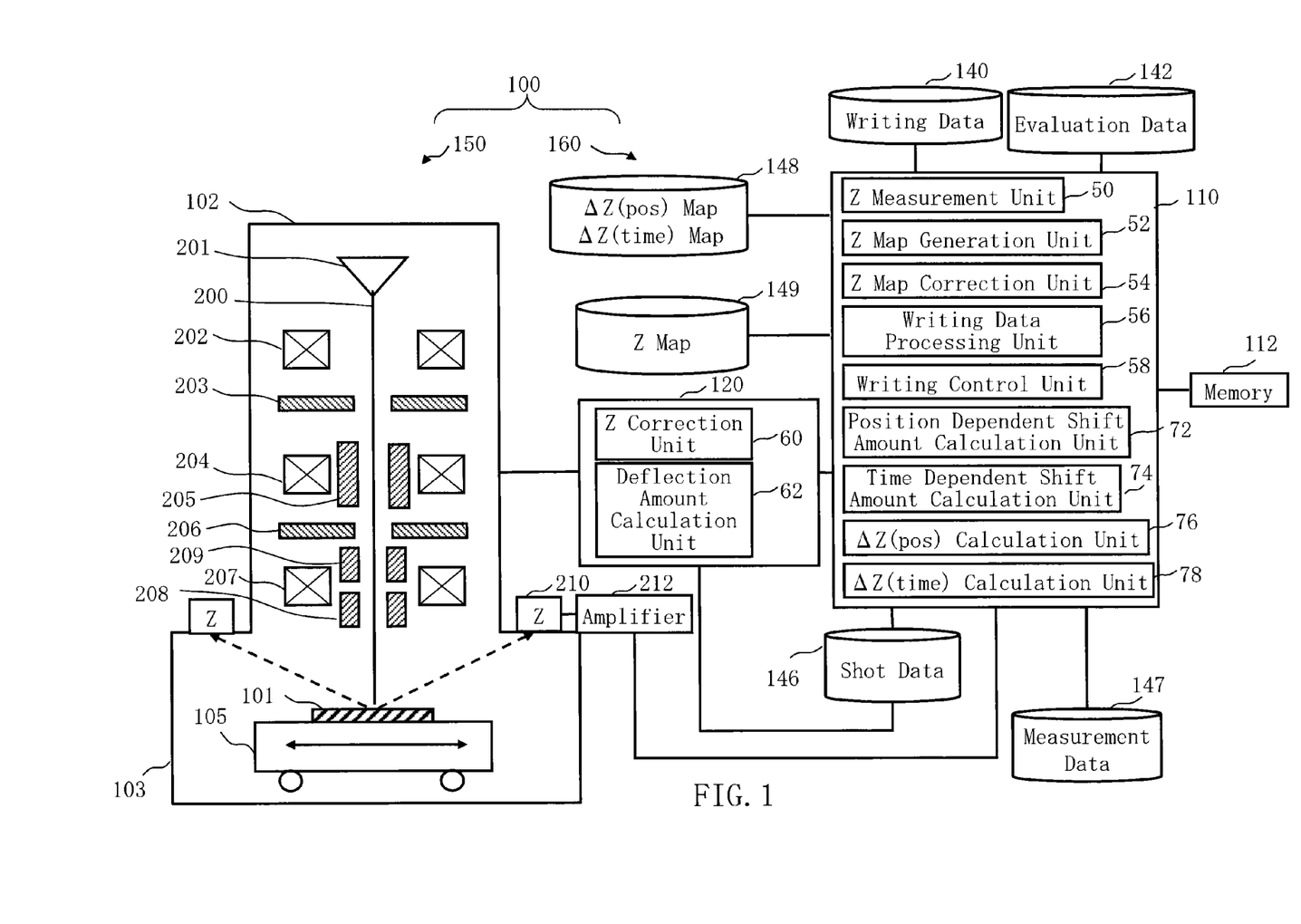
FIG. 1 is a schematic diagram showing a structure of a writing apparatus according to Embodiment 1.

FIG. 1 is a schematic diagram showing a structure of a writing or "drawing" apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped beam writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, a main deflector 208, and a sub deflector 209. In the writing chamber 103, there is arranged an XY stage 105, on which a target workpiece 101, such as a mask, serving as a writing target is placed. The target workpiece 101 is, for example, a mask for exposure used for manufacturing semiconductor devices, or a mask blank on which resist has been coated and no patterns have been formed. Moreover, in the writing chamber 103, there is arranged a Z sensor 210 including an emitting unit that emits a laser obliquely to the surface of the target workpiece 101 from above the target workpiece 101, and an optical receiving unit that receives a laser light reflected by the target workpiece 101.

The control unit 160 includes a control computer 110, a memory 112, a deflection control circuit 120, an amplifier 212, and storage devices 140, 142, 146, 147, 148, and 149, such as a magnetic disk drive. The control computer 110, the memory 112, the deflection control circuit 120, the amplifier 212, and the storage devices 140, 142, 146, 147, 148, and 149, such as a magnetic disk drive are mutually connected through a bus (not shown).

In the control computer unit 110, there are arranged a Z measurement unit 50, a Z map generation unit 52, a Z map correction unit 54, a writing data processing unit 56, a writing control unit 58, a position dependent shift amount calculation unit 72, a time dependent shift amount calculation unit 74, a position dependent Z map calculation unit 76, and a time dependent Z map calculation unit 78. Each function, such as the Z measurement unit 50, the Z map generation unit 52, the Z map correction unit 54, the writing data processing unit 56, the writing control unit 58, the position dependent shift amount calculation unit 72, the time dependent shift amount calculation unit 74, the position dependent Z map calculation unit 76, and the time dependent Z map calculation unit 78 may be configured by hardware such as an electronic circuit or may be configured by software such as a program executing these functions. Alternatively, it may be configured by a combination of software and hardware. Information input/output from/to the units described above and information being currently calculated are stored in the memory 112 each time.

In the deflection control circuit 120, there are arranged a Z correction unit 60 and a deflection amount calculation unit 62. Each function, such as the Z correction unit 60 and the deflection amount calculation unit 62, may be configured by hardware such as an electronic circuit or may be configured by software such as a program executing these functions. Alternatively, it may be configured by a combination of software and hardware. Information input/output from/to the Z correction unit 60 and the deflection amount calculation unit 62 and information being currently calculated are stored in the memory (not shown) each time.

FIG. 1 shows a structure necessary for describing Embodiment 1. Other structure elements generally necessary for the writing apparatus 100 may also be included. For example, although a multi-stage deflector namely the two stage deflector of the main deflector 208 and the sub deflector 209 are herein used for position deflection, a multi-stage deflector of three or more stage deflector may also be used to perform position deflection.

Figure 2:
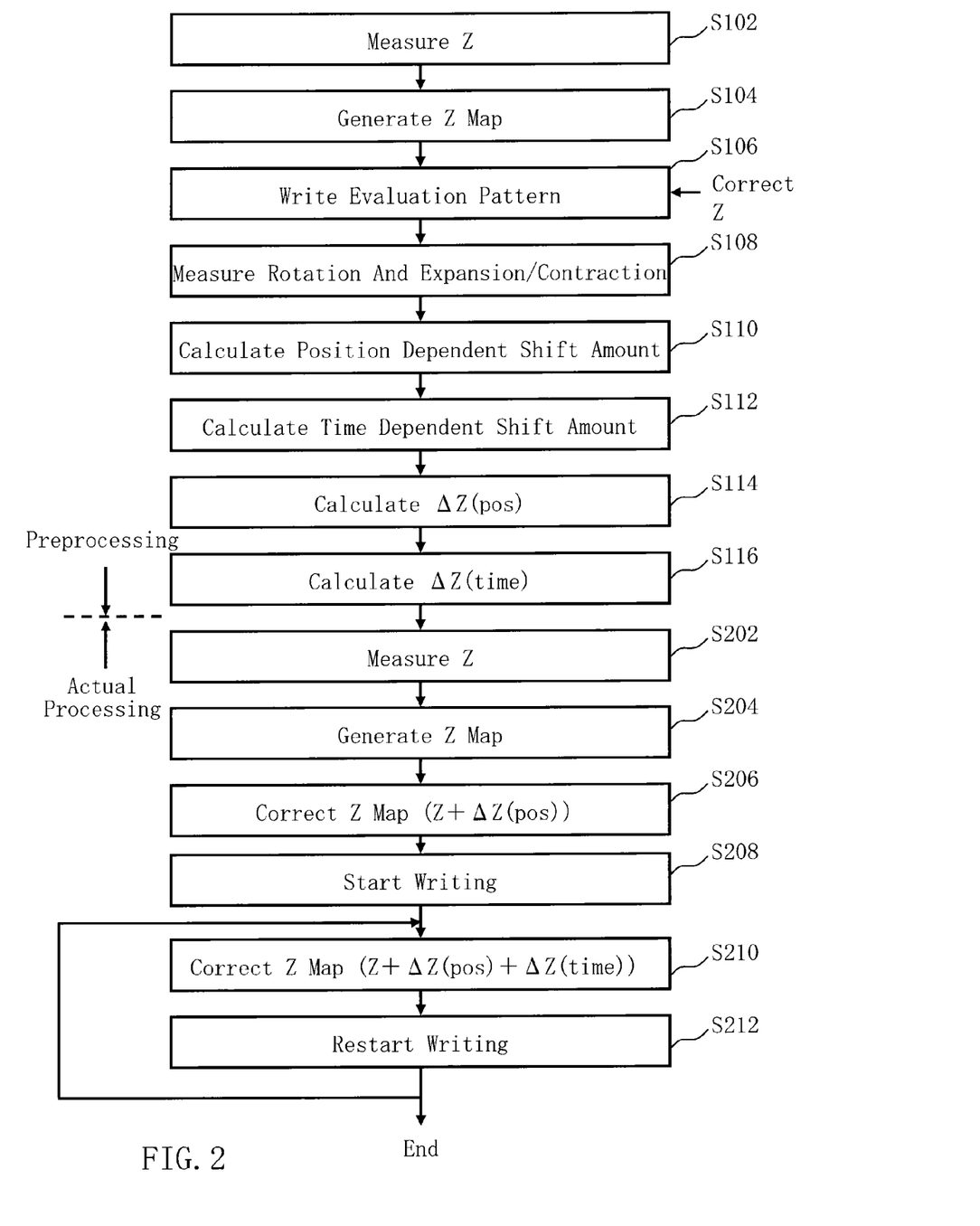
FIG. 2 is a flowchart showing main steps of a writing method according to Embodiment 1.

FIG. 2 is a flowchart showing main steps of a writing method of Embodiment 1. In FIG. 2, the writing method according to Embodiment 1 executes preprocessing, that is performed before starting writing, and actual writing processing. First, as the preprocessing, a series of steps is executed: a Z measurement step (S102), a Z map generation step (S104), an evaluation pattern writing step (S106), a rotation and expansion/contraction measurement step (S108), a position dependent shift amount calculation step (S110), a time dependent shift amount calculation step (S112), a position dependent $\Delta Z$ distribution calculation step (S114), and a time dependent $\Delta Z$ distribution calculation step (S116). Next, as the actual writing step, a series of steps is executed: a Z measurement step (S202), a Z map generation step (S204), a Z map correction step (S206), a writing start processing step (S208), a Z map correction step (S210), and a writing restart processing step (S212).

Figure 3:
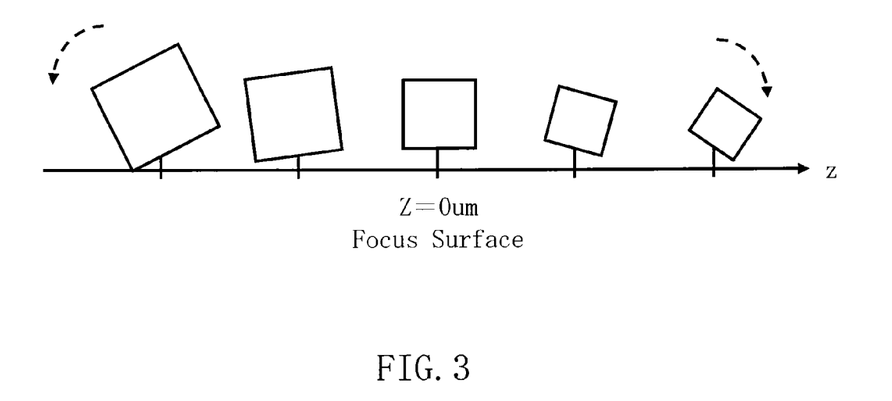
FIG. 3 is a schematic diagram explaining a pattern shift which changes depending on a height distribution according to Embodiment 1.

FIG. 3 is a schematic diagram explaining a pattern shift which changes depending on a height distribution in Embodiment 1. In the electron beam writing, as shown in FIG. 3, the position of a deflection region shifts because a deflection shift is generated for Z (the direction perpendicular to the substrate surface: the height direction) of a deflection region in a magnetic field lens system. At the height of the focus position (Z=0), when a pattern is written at an accurate position, in accordance with a change of the Z value, the deflection region rotates (rot), and further, expansion or contraction (indicated as scale or "Exp.") of the region size is also generated. For example, in the example of FIG. 3, according as the Z value shifts in the negative direction (direction becoming far from the lens system), the deflection region gradually rotates in the counterclockwise direction and the region size expands. On the contrary, according as the Z value shifts in the positive direction (direction approaching the lens system), the deflection region gradually rotates in the clockwise direction and the region size contracts. For example, when arranging a plurality of marks whose height positions are different on the XY stage 105, the change rate of deflection shift with respect to a Z value can be obtained by scanning the plurality of mark positions with an electron beam.

Figure 4:
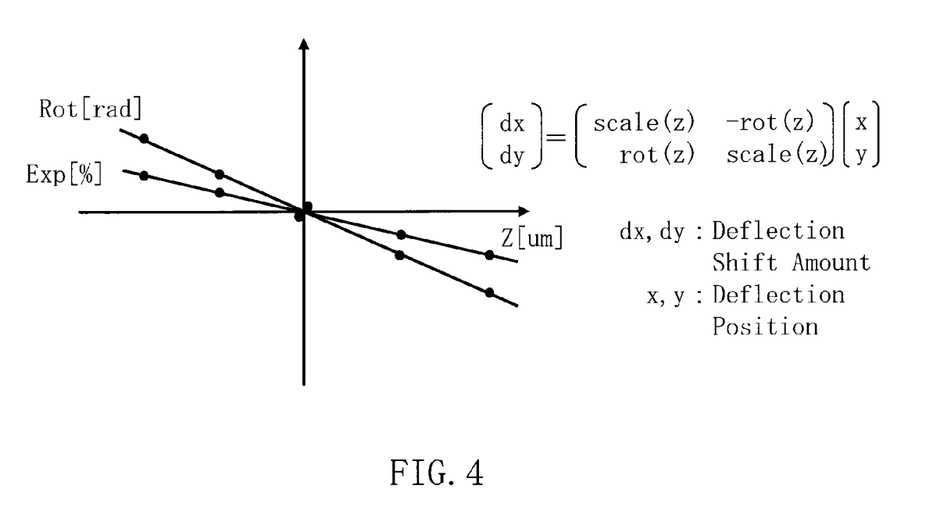
FIG. 4 shows an example of a graph and an equation representing a deflection shift with respect to a height distribution according to Embodiment 1.

FIG. 4 shows an example of a graph and an equation representing a deflection shift with respect to a height distribution according to Embodiment 1. Based on measurement values of the deflection shifts shown in FIG. 3, an amount of rotation and an amount of expansion/contraction for the Z value as shown in FIG. 4 can be calculated. Depending on this relative relation, a deflection shift amount (dx, dy) can be calculated by the equation shown in FIG. 4. That is, it is possible to calculate the deflection shift amount (dx, dy) by measuring and mapping a height distribution of a Z value (height position) at each position of the target workpiece 101 serving as a writing target by using the Z sensor 210. When actually performing writing, for example, it is recommended to calculate a deflection amount for deflecting the beam to a position which is obtained by reversing the sign of the deflection shift amount (dx, dy) and adding the reversed one to the designed writing position (x, y). However, as described above, with the miniaturization of patterns, it becomes difficult to ignore a correction residual error generated by such correction. The correction residual error is thought to include a position dependent correction residual error which is depending on a writing position and a time dependent correction residual error which is generated depending on a writing time. Then, in Embodiment 1, the position dependent correction residual error and the time dependent correction residual error are calculated to be corrected. Therefore, as the preprocessing before the actual writing, such a correction residual error is calculated.

Figure 5A:
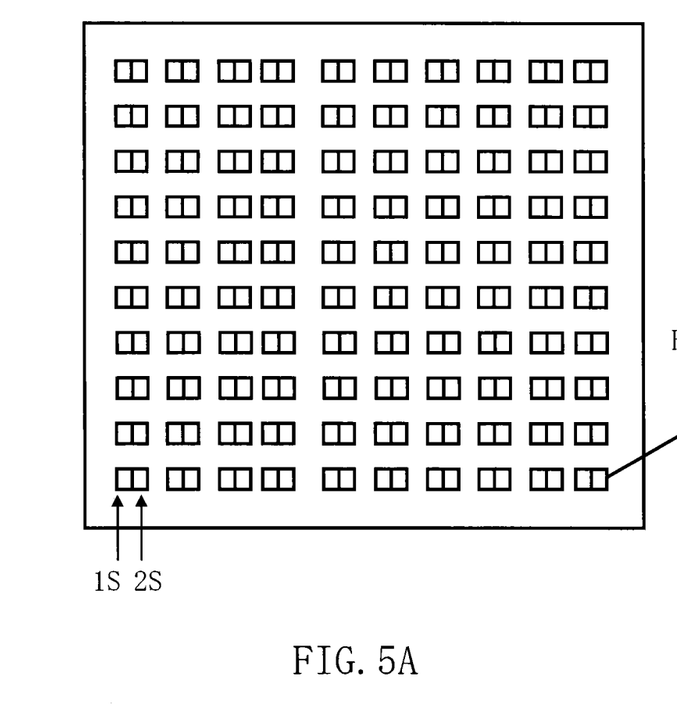
FIGS. 5A and 5B show an example of an evaluation substrate and an evaluation pattern according to Embodiment 1.
Figure 5B:
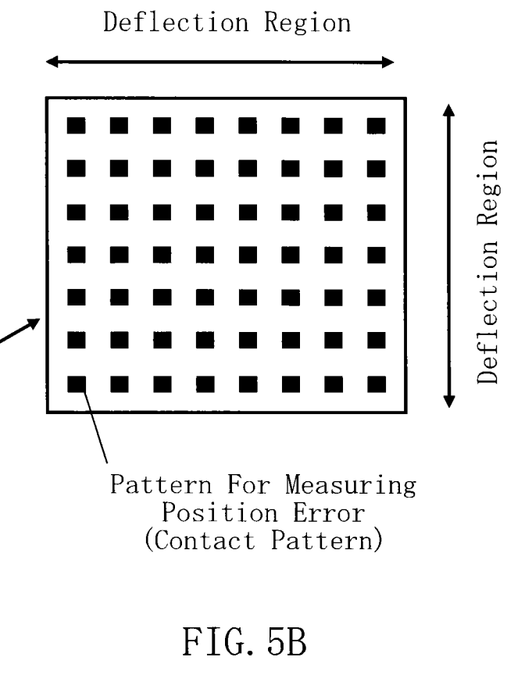

FIGS. 5A and 5B show an example of an evaluation substrate and an evaluation pattern according to Embodiment 1. As shown in FIG. 5A, in the evaluation substrate, a chip pattern of the first order of writing (denoted as "1s") and a chip pattern of the second order of writing (denoted as "2s") are written in contiguity or in the neighborhood. An evaluation pattern is composed of a plurality of chip patterns arranged in a grid on the evaluation substrate surface. As shown in FIG. 5B, it is preferable for each chip to have a layout in which a plurality of contact patterns of a quadrangle, such as a square or a rectangle, are arranged for measuring a position. It is suitable for one chip to be set to be a deflection region size, for example. Then, the evaluation substrate is placed on the XY stage 105 of the writing apparatus 100 in order to write such an evaluation pattern. Pattern data of the evaluation pattern is input from the outside into the storage device 142 to be stored.

In the Z measurement step (S102), first, a height position (Z value) of the surface of the evaluation substrate is measured. While the XY stage 105 is moving, a Z value of each position of a plurality of positions on the evaluation substrate surface is measured by the Z sensor 210. An output of the Z sensor 210 is transmitted to the Z measurement unit 50 through the amplifier 212. Thus, the Z measurement unit 50 obtains measured values. Although the precision is further enhanced when the position for measuring a Z value is subdivided, for example, it is also acceptable to perform measurement at each position where the chip described above is arranged.

In the Z map generation step (S104), the Z map generation unit 52 (an example of a height distribution generation unit) generates a height distribution (Z map) based on the obtained Z values. The Z map may be stored in the memory 149.

In the evaluation pattern writing step (S106), first, the writing data processing unit 56 reads pattern data of the evaluation pattern from the storage device 142, performs data conversion processing of a plurality of steps, and generates shot data unique to the apparatus. The shot data is temporarily stored in the memory 146. Under the control of the writing control unit 58, the deflection control circuit 120 inputs the shot data, and the Z correction unit 60 calculates a deflection shift amount (dx, dy) for the Z value (height position) described above. Then, the amount calculation unit 62 calculates a deflection amount for deflecting the beam to the position which is obtained by reversing the sign of the calculated deflection shift amount (dx, dy) and adding the reversed one to the deflection position (x, y) in the pattern data of the evaluation pattern. As described above, a deflection amount at the time of shooting the beam to each position is calculated. Then, under the control of the writing control unit 58, the writing unit 150 sets deflection regions all over the evaluation substrate as shown in FIG. 5A, and writes an evaluation pattern shown in FIG. 5B in each deflection region. For example, writing is advanced in order from the lower left to the right in the same row. When writing the row concerned has completed, it shifts to the row upper by one to continue the writing. Thus, the writing is advanced in order to write the entire evaluation substrate surface. Such an operation is for example repeated twice, such as writing the first writing order (1s) and the second writing order (2s). It is recommended in the second writing order (2s) that the same pattern as the evaluation pattern written in the first writing order (1s) is written at the position next to or near the evaluation pattern written in the first writing order (1s).

In the rotation and expansion/contraction measurement step (S108), the position of the contact pattern of each chip is measured, and a rotation amount and an expansion/contraction amount in the deflection region where each chip is arranged are measured. The evaluation pattern written as described above is a pattern written while the deflection shift at the height position of the evaluation substrate surface is corrected. Therefore, the rotation amount and the expansion/contraction amount in each deflection region can be known by measuring the position of the evaluation pattern. For example, by performing fitting on each chip by a linear function of two variables x and y, the rotation amount (rot) and the expansion/contraction amount (scale) of a deflection region at each position can be calculated. The measurement result (measurement data) of the evaluation pattern is input from the outside into the storage device 147 to be stored.

In the position dependent shift amount calculation step (S110), the position dependent shift amount calculation unit 72 reads the measurement data of the evaluation pattern, and calculates a shift amount depending on the writing position. Here, for example, by calculating a mean value of the measurement result in 1s and the measurement result in 2s at each position, a shift amount depending on a writing position, not depending on time, can be obtained.

In the time dependent shift amount calculation step (S112), the time dependent shift amount calculation unit 74 reads the measurement data of the evaluation pattern, and calculates a shift amount depending on a writing time. Here, for example, the position dependent shift amount previously calculated based on the measurement result in 1s is deducted at each position. Similarly, the position dependent shift amount previously calculated based on the measurement result in 2s is deducted at each position. Then, by arranging difference values in order of the writing time, a shift amount depending on a time, not depending on a position, can be calculated.

According to Embodiment 1, these position dependent shift amount and time dependent shift amount are further converted into Z values.

In the position dependent $\Delta Z$ distribution calculation step (S114), the position dependent Z map calculation unit 76 (an example of a position dependent height distribution calculation unit) calculates a position dependent height distribution $\Delta z$ (pos.) by converting a pattern position error (a position shift amount to the design position) generated depending on a writing position of the substrate into a Z value in the height direction. A z value ($\Delta z$) can be obtained, by using the equation shown in FIG. 4, by a back calculation from the position dependent shift amount (dx, dy) at each position (x, y). As described above, the position dependent height distribution $\Delta z$ (pos.) (or also called a $\Delta z$ (pos.) map) is calculated. The calculated position dependent height distribution $\Delta z$ (pos.) is stored in the memory 148.

In the time dependent $\Delta Z$ distribution calculation step (S116), the time dependent Z map calculation unit 78 (an example of a time dependent height distribution calculation unit) calculates a time dependent height distribution $\Delta z$ (time) by converting a pattern position error (a position shift amount to the design position) generated depending on a writing time for the substrate into a value in the height direction. A z value ($\Delta z$) can be obtained, by using the equation shown in FIG. 4, by a back calculation from the time dependent shift amount (dx, dy) at each position (x, y). As described above, the time dependent height distribution $\Delta z$ (time) (or also called a $\Delta z$ (time) map) is calculated. The Calculated time dependent height distribution $\Delta z$ (time) is stored in the memory 148.

The position dependent height distribution $\Delta z$ (pos.) and the time dependent height distribution $\Delta z$ (time) are obtained by the procedure described above. Although in the above example the position dependent height distribution $\Delta z$ (pos.) and the time dependent height distribution $\Delta z$ (time) are calculated in the writing apparatus 100, it is not limited thereto. They may be calculated outside the writing apparatus 100 and stored in the memory 148. Then, by using them, actual writing is performed to the target workpiece 101 serving as a writing target substrate. Writing data (layout data) to be written to the target workpiece 101 is input from the outside into the memory 140 to be stored.

In the Z measurement step (S202), the Z measurement unit 50 measures a height distribution of the substrate used as a writing target. In other words, a height position (Z value) of the writing surface of the target workpiece 101 used as a writing target substrate is measured at each position. The measuring method is the same as described above.

In the Z map generation step (S204), the Z map generation unit 52 generates a height distribution (Z map) by using the height position (Z value) measured at each position. The Z map is stored in the memory 149.

In the Z map correction step (S206), the Z map correction unit 54 inputs a position dependent height distribution which is obtained by converting a pattern position error generated depending on a writing position of the substrate into a value in the height direction, and adds the position dependent height distribution to the height distribution of the substrate in order to correct the height distribution of the substrate. The Z map correction unit 54 is an example of a height distribution correction unit. Specifically, the Z map correction unit 54 reads the position dependent height distribution $\Delta z$ (pos.) from the storage device 148, and adds the value of a corresponding position of the position dependent height distribution $\Delta z$ (pos.) to each value in the generated Z map. Thereby, the Z map in which a shift amount depending on a position has been corrected can be obtained. The Z map after the correction is stored in the memory 149, and replaced with the Z map having been previously stored. Alternatively, it may be overwritten.

In the writing start processing step (S208), first, the writing data processing unit 56 reads the writing data from the memory 140, and performs data conversion processing of a plurality of steps to generate shot data unique to the apparatus. In order to write a figure pattern by the writing apparatus 100, each figure pattern defined in the writing data needs to be divided into a size which can be irradiated by one beam shot. Then, the writing data processing unit 56 divides a figure pattern indicated by the writing data into a size which can be irradiated by one beam shot so as to generate a shot figure. Shot data is generated for each shot figure. There are defined in the shot data a figure type, a figure size, an irradiation position, and a dose, for example. The generated shot data is temporarily stored in the memory 146 one by one.

In a deflection shift amount calculation step, the Z correction unit 60 reads the shot data, and for each shot data, referring to a corrected Z' map (Z map+$\Delta z$(pos.)), calculates a deflection shift amount (dx, dy) of the pattern to be written at each position (x, y). The Z correction unit 60 is an example of a deflection shift amount calculation unit. The equation shown in FIG. 4 can be used for the correction calculation.

In a deflection amount calculation step, the deflection amount calculation unit 62 calculates a deflection amount for deflecting the electron beam 200 to a position (x, y) where the obtained deflection shift amount (dx, dy) has been corrected. Specifically, the deflection amount calculation unit 62 calculates a deflection amount for deflecting the beam to the position which is obtained by reversing the sign of the calculated deflection shift amount (dx, dy) and adding the reversed one to the deflection position (x, y) in the shot data. As described above, the deflection amount, which is necessary for shooting the beam to each position, is calculated. Then, under the control of the writing control unit 58, the writing unit 150 deflects the electron beam 200 by the obtained deflection amount, and writes a pattern onto the target workpiece 101. Specific operations will be described below.

The electron beam 200 emitted from the electron gun assembly 201 (emission unit) irradiates the entire first aperture plate 203 having a quadrangular, such as a rectangular, opening by the illumination lens 202. At this point, the electron beam 200 is shaped to be a quadrangle such as a rectangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam. After having passed through the second aperture plate 206, the electron beam 200 of a second aperture image is focused by the objective lens 207 and deflected by the main deflector 208 and the sub-deflector 209, and reaches a desired position on the target workpiece 101 on the XY stage 105 which continuously moves. FIG. 1 shows the case of using a multi-stage deflection, namely the two stage deflector of the main and sub deflectors, for the position deflection. In such a case, what is needed is to deflect the electron beam 200 of the shot concerned to the reference position of a subfield (SF), which is made by virtually dividing the writing region, by using the main deflector 208 while following the stage movement, and to deflect the beam of the shot concerned to each irradiation position in the SF by using the sub-deflector 209.

Here, as the time has passed since starting the writing, a shift amount depending on time is generated. Therefore, according to Embodiment 1, after a predetermined time has passed since starting the writing processing, the time dependent shift amount which has been previously obtained is corrected. The writing processing is performed for each stripe region made by dividing the writing region into strip-shaped stripe regions. In the electron beam writing, a beam drift occurs by the passage of time, etc. Therefore, for example, the writing processing is temporarily stopped periodically or irregularly during the writing, to perform drift correction. For example, writing is temporarily stopped to perform correction when ten minutes or twenty minutes have passed. The drift correction is often performed between stripe regions. Then, in Embodiment 1, when the writing processing is once stopped, such as the case of the drift correction, the Z map is corrected.

In the Z map correction step (S210), the Z map correction unit 54 further inputs the time dependent height distribution $\Delta z$ (time), and adds the time dependent height distribution $\Delta z$ (time) to the height distribution of the substrate, which has been corrected before starting the writing so as to further correct the height distribution of the substrate. Specifically, when once stopping the writing processing, the Z map correction unit 54 measures a writing time period from starting the writing to stopping the processing. The Z map correction unit 54 reads the time dependent height distribution $\Delta z$ (time) from the storage device 148, and adds a height position $\Delta z$ (time) corresponding to the writing time period to the value of each position of the Z map. Thereby, the Z map in which a shift amount depending on time is corrected can further be obtained. The Z map after the correction is stored in the memory 149, and replaced with the Z map having been previously stored, or alternatively, it may be overwritten.

In the writing restart processing step (S212), the writing processing is resumed. Specifically, as a deflection shift amount calculation step, the Z correction unit 60 reads shot data, and, for each shot data, referring to a Z" map (Z map+ $\Delta z$(pos.) +$\Delta z$ (time) in which the time dependent shift amount has been further corrected, calculates a deflection shift amount (dx, dy) of the pattern to be written at each position (x, y). The Z correction unit 60 is an example of the deflection shift amount calculation unit. The equation shown in FIG. 4 can be used for the correction calculation.

In a deflection amount calculation step, the deflection amount calculation unit 62 calculates a deflection amount for deflecting the electron beam 200 to a position (x, y) where the obtained deflection shift amount (dx, dy) has been corrected. Specifically, the deflection amount calculation unit 62 calculates a deflection amount for deflecting the beam to the position which is obtained by reversing the sign of the calculated deflection shift amount (dx, dy) and adding the reversed one to the deflection position (x, y) in the shot data. As described above, the deflection amount, which is necessary for shooting the beam to each position, is calculated. Then, under the control of the writing control unit 58, the writing unit 150 deflects the electron beam 200 by the obtained deflection amount, and writes a pattern onto the target workpiece 101.

Then, at the next writing stop period, the steps from the Z map correction step (S210) to the writing restart processing step (S212) are again repeated. In that case, in the next Z map correction step (S210), a height position $\Delta z$ corresponding to the time period from the writing restarting to the further next stopping may be read from the time dependent height distribution $\Delta z$ (time) so as to be added. Alternatively, instead, it is also acceptable to differentiate the time dependent height distribution $\Delta z$ (time) value which has been previously added, and to read a height position $\Delta z$ corresponding to the time period from the original writing starting to the current stopping, from the time dependent height distribution $\Delta z$ (time) so as to be added.

As described above, the time dependent height distribution $\Delta z$ (time) is corrected according to the passage of time. Therefore, in the beginning, a correction residual error depending on a position can be corrected, and, after starting writing, a correction residual error depending on time can be corrected according to the passage of time.

In the example described above, both a correction residual error depending on a position and a correction residual error depending on time are corrected. However, it is not limited thereto. Although the precision degrades, it is also acceptable to correct only a correction residual error depending on time in the Z map, or alternatively, to correct only a correction residual error depending on a position. Whichever is employed, a correction residual error that is not able to be corrected by using only original Z map can be corrected. Therefore, a correction residual error that remains when only height distribution of the substrate is used can be further corrected. Thus, a residual error of a shape occurred due to a deflection can be corrected, thereby enhancing the deflection precision further than before.

Referring to specific examples, Embodiment has been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately when necessary.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a measurement unit configured to measure a plurality of height positions of a substrate to be written;
a height distribution correction unit configured to input a position dependent height distribution that is obtained by converting each position error of a pattern generated depending on each corresponding writing position of the substrate into a value in a height direction, and to add the position dependent height distribution to a height distribution that is obtained based on the plurality of height positions, to generate a corrected height distribution of the substrate, wherein the each position error of the pattern includes a component depending on each corresponding writing position of the substrate, and excludes a component depending on each corresponding writing time for the substrate;
a deflection shift amount calculation unit configured to calculate a deflection shift amount of a pattern to be written by using the corrected height distribution;
a deflection amount calculation unit configured to calculate a deflection amount for deflecting a charged particle beam to a position where a calculated deflection shift amount has been corrected; and
a writing unit configured to write a pattern on the substrate by deflecting the charged particle beam by a calculated deflection amount.

2. The apparatus according to claim 1, wherein
the height distribution correction unit further inputs a time dependent height distribution that is obtained by converting each position error of a pattern generated depending on each corresponding writing time for the substrate into a value in the height direction, and further adds the time dependent height distribution to a corrected height distribution of the substrate, in order to further correct the height distribution of the substrate,
the deflection shift amount calculation unit further calculates a deflection shift amount of a pattern to be written by using the height distribution corrected by the time dependent height distribution, and
the deflection amount calculation unit further calculates a deflection amount for deflecting a charged particle beam to a position where the deflection shift amount based on the height distribution corrected by using the time dependent height distribution has been corrected.

3. The apparatus according to claim 1, further comprising
a height distribution generation unit configured to generate the height distribution by using a measured height position of the substrate.

4. The apparatus according to claim 1, further comprising
a position dependent height distribution calculation unit
configured to calculate the position dependent height distribution that is obtained by converting each position error of a pattern generated depending on each corresponding writing position of the substrate into a value in the height direction.

5. The apparatus according to claim 2, further comprising
a time dependent height distribution calculation unit configured to calculate the time dependent height distribution that is obtained by converting a position error of a pattern generated depending on a writing time for the substrate into a value in the height direction.

6. A charged particle beam writing apparatus comprising:
a measurement unit configured to measure a plurality of height positions of a substrate to be written;
a height distribution correction unit configured to input a time dependent height distribution that is obtained by converting each position error of a pattern generated depending on each corresponding writing time for the substrate into a value in a height direction, and to add the time dependent height distribution to a height distribution that is obtained based on the plurality of height positions, to generate a corrected height distribution of the substrate, wherein the each position error of the pattern includes a component depending on each corresponding writing time for the substrate and excludes a component depending on each corresponding writing position of the substrate;
a deflection shift amount calculation unit configured to calculate a deflection shift amount of a pattern to be written by using the corrected height distribution;
a deflection amount calculation unit configured to calculate a deflection amount for deflecting a charged particle beam to a position where a calculated deflection shift amount has been corrected; and
a writing unit configured to write a pattern on the substrate by deflecting the charged particle beam by a calculated deflection amount.

7. The apparatus according to claim 6, further comprising
a height distribution generation unit configured to generate the height distribution by using a measured height position of the substrate.

8. The apparatus according to claim 6, further comprising
a time dependent height distribution calculation unit
configured to calculate the time dependent height distribution that is obtained by converting each position error of a pattern generated depending on each corresponding writing time for the substrate into a value in the height direction.

9. A charged particle beam writing method comprising:
measuring a plurality of height positions of a substrate to be written;
inputting a position dependent height distribution that is obtained by converting each position error of a pattern generated depending on each corresponding writing position of the substrate into a value in a height direction, and adding the position dependent height distribution to a height distribution that is obtained based on the plurality of height positions, to generate a corrected height distribution of the substrate, wherein the each position error of the pattern includes a component depending on each corresponding writing position of the substrate, and excludes a component depending on each corresponding writing time for the substrate;
calculating a deflection shift amount of a pattern to be written by using the corrected height distribution;
calculating a deflection amount for deflecting a charged particle beam to a position where a calculated deflection shift amount has been corrected; and
writing a pattern on the substrate by deflecting the charged particle beam by a calculated deflection amount.

10. A charged particle beam writing method comprising:
measuring a plurality of height positions of a substrate to be written;
inputting a time dependent height distribution that is obtained by converting each position error of a pattern generated depending on each corresponding writing time for the substrate into a value in a height direction, and adding the time dependent height distribution to a height distribution that is obtained based on the plurality of height positions, to generate a corrected height distribution of the substrate, wherein the each position error of the pattern includes a component depending on each corresponding writing time for the substrate and excludes a component depending on each corresponding writing position of the substrate;

calculating a deflection shift amount of a pattern to be written by using the corrected height distribution;

calculating a deflection amount for deflecting a charged particle beam to a position where a calculated deflection shift amount has been corrected; and writing a pattern on the substrate by deflecting the charged particle beam by a calculated deflection amount.

* * * * *